US010785893B1

United States Patent
Kuo et al.

(10) Patent No.: US 10,785,893 B1
(45) Date of Patent: Sep. 22, 2020

(54) HEAT DISSIPATION MODULE AND ELECTRONIC DEVICE

(71) Applicant: HTC Corporation, Taoyuan (TW)

(72) Inventors: Chih-Yao Kuo, Taoyuan (TW); Chin-Kai Sun, Taoyuan (TW); Chun-Lung Chu, Taoyuan (TW); Wei-Cheng Liu, Taoyuan (TW)

(73) Assignee: HTC Corporation, Taoyuan (TW)

( * ) Notice: Subject to any disclaimer, the term of this patent is extended or adjusted under 35 U.S.C. 154(b) by 0 days.

(21) Appl. No.: 16/403,616

(22) Filed: May 6, 2019

(51) Int. Cl.
*H05K 7/20* (2006.01)
*H05K 7/14* (2006.01)
*H05K 1/18* (2006.01)
*H05K 5/03* (2006.01)

(52) U.S. Cl.
CPC ......... *H05K 7/20381* (2013.01); *H05K 1/181* (2013.01); *H05K 5/03* (2013.01); *H05K 7/1427* (2013.01); *H05K 7/20327* (2013.01); *H05K 7/20336* (2013.01)

(58) Field of Classification Search
None
See application file for complete search history.

(56) References Cited

U.S. PATENT DOCUMENTS

| 7,969,738 | B2 * | 6/2011 | Koo | F25B 21/02 136/211 |
| 7,986,520 | B2 * | 7/2011 | Yamaguchi | F28D 15/0275 165/185 |
| 8,462,499 | B2 * | 6/2013 | Nishioka | G06F 1/203 174/548 |
| 9,322,580 | B2 * | 4/2016 | Hershberger | H05K 1/0203 |
| 9,882,646 | B2 * | 1/2018 | Blumenthal | H05K 7/20336 |
| 2003/0183269 | A1 * | 10/2003 | Maeda | G06F 1/203 136/211 |
| 2009/0072385 | A1 * | 3/2009 | Alley | H01L 23/38 257/713 |
| 2009/0205696 | A1 * | 8/2009 | Koester | H01L 23/38 136/201 |

(Continued)

FOREIGN PATENT DOCUMENTS

| CN | 106970690 | 7/2017 |
| JP | 2001230584 | 8/2001 |

(Continued)

OTHER PUBLICATIONS

Muhammad Fairuz Remeli et al., "Passive Power Generation and Heat Recovery from Waste Heat", Advanced Materials Research, Mar. 2015, pp. 789-794.

(Continued)

*Primary Examiner* — Courtney L Smith
(74) *Attorney, Agent, or Firm* — JCIPRNET

(57) ABSTRACT

A heat dissipation module and an electronic device are provided. The heat dissipation module includes a first heat transfer member, a second heat transfer member, and a cooling element. The first heat transfer member has a first end and a second end opposite to the first end. The second heat transfer member has a third end and a fourth end opposite to the third end. The cooling element disposed between the second end and the third end is configured to allow or block the heat transferring between the second end and the third end.

9 Claims, 3 Drawing Sheets

(56) References Cited

U.S. PATENT DOCUMENTS

| | | | | |
|---|---|---|---|---|
| 2009/0316359 | A1* | 12/2009 | Blanco, Jr. | F28D 15/0275 |
| | | | | 361/699 |
| 2013/0135822 | A1* | 5/2013 | Chen | G06F 1/20 |
| | | | | 361/679.52 |
| 2015/0342023 | A1* | 11/2015 | Refai-Ahmed | H05K 1/0203 |
| | | | | 361/696 |
| 2018/0323361 | A1 | 11/2018 | Edwards et al. | |
| 2019/0110356 | A1 | 4/2019 | Silvano De Sousa | |

FOREIGN PATENT DOCUMENTS

| | | |
|---|---|---|
| TW | M354785 | 4/2009 |
| TW | 201510464 | 3/2015 |

OTHER PUBLICATIONS

"Office Action of Taiwan Counterpart Application", dated Feb. 19, 2020, p. 1-p. 3.

\* cited by examiner

HEAT DISSIPATION MODULE AND ELECTRONIC DEVICE

BACKGROUND

Technical Field

The disclosure relates to a module and a device, more particularly, relates to a heat dissipation module and an electronic device.

Description of Related Art

Along with the continuous improvement of technology, the development of various electronic products becomes faster. In addition to making phone call, the electronic device, such as mobile phone, is developed to perform functions of a variety of application programs. The functions of application programs include taking photographs by the lens of the electronic device and performing audio and visual entertainment, etc. When using the application programs, the electronic components, such as lenses or processors, etc., generate heat quickly. Therefore, how to disperse the heat generated by the electronic components and how to reduce discomfort felt by the user due to high temperature when holding the electronic device are an important directions for research and development.

SUMMARY

The disclosure provides a heat dissipation module and an electronic device capable of improve the problem that the electronic device is locally overheated to cause discomfort to the user.

The heat dissipation module of the disclosure includes a first heat transfer member, a second heat transfer member, and a cooling element. The first heat transfer member has a first end and a second end opposite to the first end. The second heat transfer member has a third end and a fourth end opposite to the third end. The cooling element is disposed between the second end and the third end and is configured to allow or block the heat transferring between the second end and the third end.

An electronic device disclosure includes a first heating element, a second heating element, and a heat dissipation module. The heat dissipation module includes a first heat transfer member, a second heat transfer member, and a cooling element. The first heat transfer member has a first end and a second end opposite to the first end. The second heat transfer member has a third end and a fourth end opposite to the third end. The cooling element is disposed between the second end and the third end and is configured to allow or block the heat transferring between the second end and the third end.

Based on the above, in the heat dissipation module and the electronic device of the disclosure, the range and the transferring direction of the heat inside the electronic device are controlled by the control unit, so that the user has a good comfort level in different holding modes.

In order to make the aforementioned and other features and advantages of the disclosure more comprehensible, embodiments accompanying figures are described in detail belows.

BRIEF DESCRIPTION OF THE DRAWINGS

FIG. 2 is a partial cross-sectional view of the vicinity of a cooling element in

FIG. 1.

DESCRIPTION OF THE EMBODIMENTS

Figure 1:
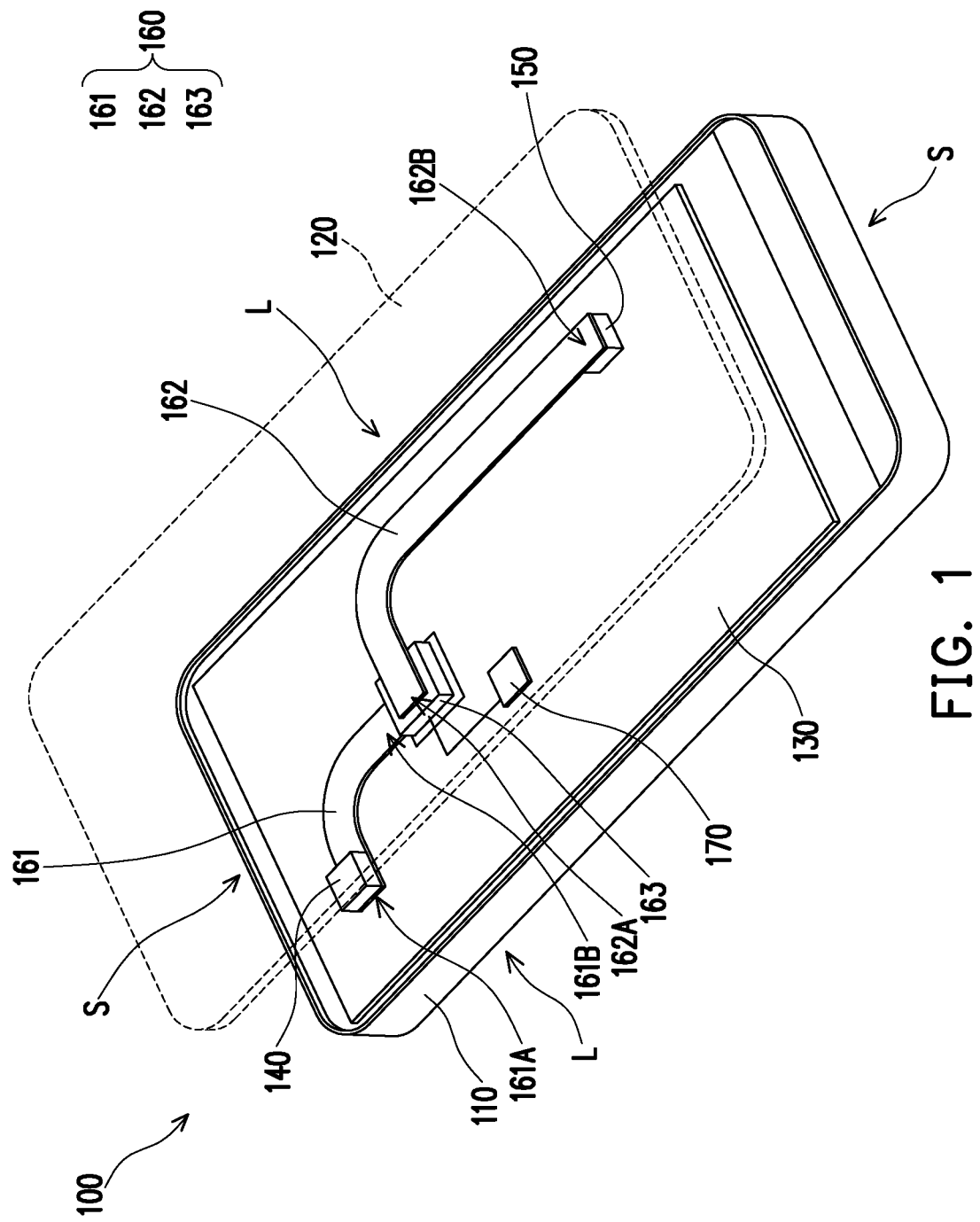
FIG. 1 is a schematic view of an electronic device according to one embodiment of the invention.

FIG. 1 is a schematic view of an electronic device according to one embodiment of the invention. Referring to FIG. 1, an electronic device 100 of the present embodiment includes a first heating element 140, a second heating element 150, and a heat dissipation module 160. As an option, the electronic device 100 may further include a case 110, a cover 120, and a printed circuit board 130. In order to clearly illustrate the elements inside the electronic device 100, the cover 120, the touch panel (not shown), and/or the display panel (not shown) of the electronic device 100 are separated and shown in FIG. 1 as dashed line to conveniently show the internal components. The first heating element 140 and the second heating element 150 are disposed on the printed circuit board 130. The printed circuit board 130, the first heating element 140, the second heating element 150, and the heat dissipation module 160 are all disposed in the case 110. The case 110 and the cover 120 are assembled. The electronic device 100 may be a mobile phone or tablet computer, but the disclosure is not limited thereto.

The first heating element 140, the second heating element 150, and the heat dissipation module 160 are disposed on the printed circuit board 130. The heat dissipation module 160 of the present embodiment includes the first heat transfer member 161, a second heat transfer member 162, and a cooling element 163. The first heat transfer member 161 has the first end 161A and the second end 161B opposite to the first end 161A, and the first end 161A is in thermal contact with the first heating element 140. The second heat transfer member 162 has the third end 162A and the fourth end 162B opposite to the third end 162A, and the fourth end 162B is in thermal contact with the second heating element 150. In the present embodiment, the first heating element 140 may be the camera module of the electronic device 100 as an example. The second heating element may be the central processing unit (CPU) or other elements having high performance operation, as an example. In comparison to the second heating element 150, the first heating element 140 has less power consumption and generates less heat. The heat generated by the first heating element 140 and the second heating element 150 can be transferred through the heat dissipation module 160, so as to dissipate the heat from the first heating element 140 and the second heating element 150.

Figure 2:
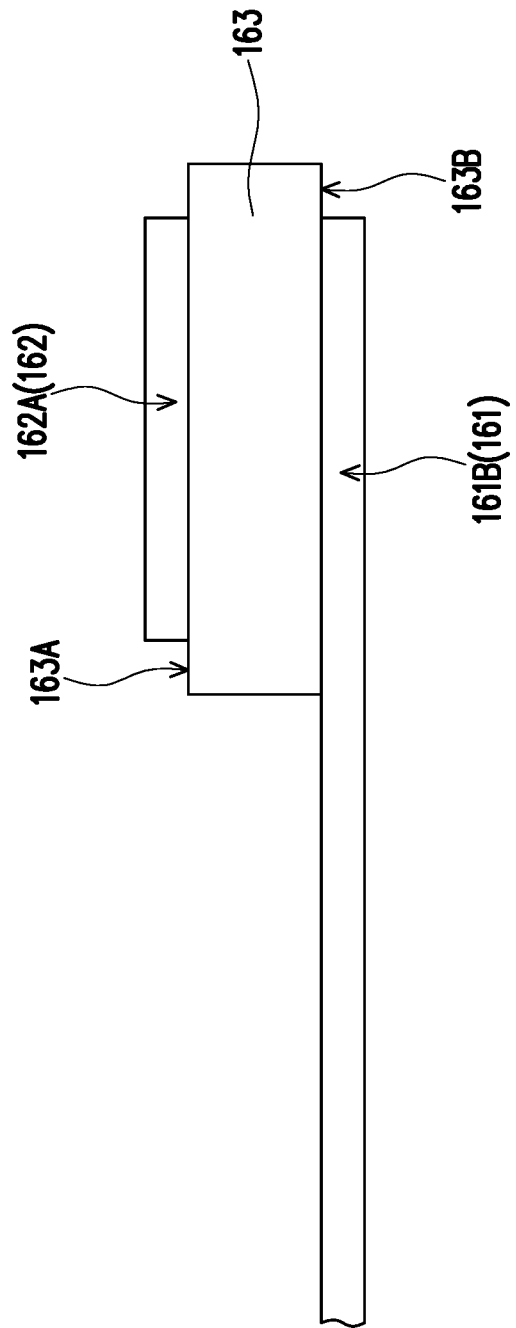

FIG. 2 is a partial cross-sectional view of the vicinity of a cooling element in FIG. 1. Referring to FIG. 1 and FIG. 2, the cooling element 163 may be a thermoelectric cooling unit as an example and has a condensing surface 163A and a heating surface 163B. The cooling element 163 is disposed between the second end 161B of the first heat transfer member 161 and the third end 162A of the second heat transfer member 162. In the present embodiment, the condensing surface 163A of the cooling element 163 is attached to the second heat transfer member 162, and the heating surface 163B of the cooling element 163 is attached to the first heat transfer member 161. Therefore, the cooling element 163 is configured to allow one-way heat transferring from the third end 162A of the second heat transfer member 162 to the second end 161B of the first heat transfer member 161. However, according to different designs, the heat transferring can also be a one-way heat transferring from the second end 161B of the first heat transfer member 161 to the third end 162A of the second heat transfer member 162 or can be a two-way heat transferring, the disclosure is not limited thereto.

Otherwise, the electronic device 100 further includes a control unit 170 connected to the cooling element 163 and configured to control the cooling element 163 to allow or block the heat transferring between the second end 161B and the third end 162A. More specifically, when the power consumption of the second heating element 150 is greater than a preset value, for example, when the electronic device 100 is used to perform high-performance application programs, the control unit 170 controls the cooling element 163 to allow the heat transferring between the second end 161B and the third end 162A, so the heat is dispersed from the second heat transfer member 162 to the first heat transfer member 161 in order to increase heat dissipation efficiency. In contrast, when the power consumption of the second heating element 150 is smaller than a preset value, for example, when the electronic device 100 is used to perform application programs that require only the first heating element 140 without starting the second heating element 150 or that only require the second heating element 150 operating with low power consumption, the control unit 170 controls the cooling element 163 to block the heat transferring between the second end 161B and the third end 162A, so the heat remains in the range covered by the first heat transfer member 161 for heat dissipation. That is to say, when the first heating element 140 serves as the main operating unit of the electronic device 100 and generates heat, the cooling element 163 is controlled by the control unit 170 to block the heat transferring between the second end 161B and the third end 162A. In the present embodiment, the first heat transfer member 161 and the second heat transfer member 162 are heat pipes or vapor chambers, but the disclosure is not limited thereto.

Figure 3:
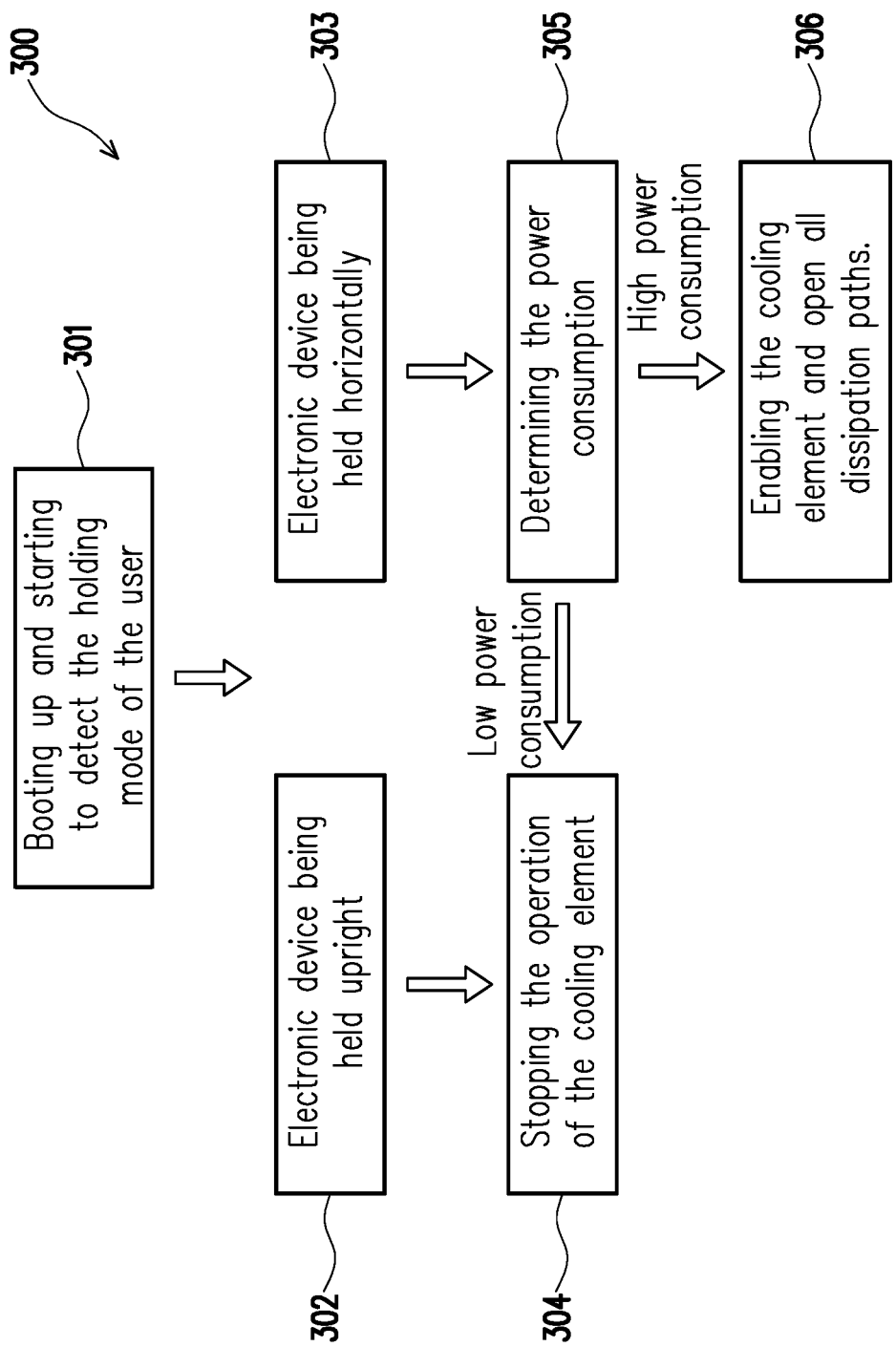
FIG. 3 is a flow chart illustrating that the electronic device determines the range of heat transfer according to one embodiment of the invention.

FIG. 3 is a flow chart illustrating that the electronic device determines the range of heat transfer according to one embodiment of the invention. In order to better understand the operation principle of the heat dissipation module 160 of the electronic device 100 in the disclosure, please refer to FIG. 1 and FIG. 3.

As shown in block 301 of the flow chart 300, after the electronic device 100 is booted up, for example, an inertial measurement unit (IMU) is used to start the function of detecting the holding mode of the user. Generally, the above-mentioned holding mode is categorized as a vertical holding mode, which the electronic device 100 is held upright, as indicated in block 302 and a horizontal holding mode, which the electronic device 100 is held horizontally, as indicated in block 303. To be more specific, the vertical holding mode indicates that the user grips the electronic device 100 at the long sides L to make the electronic device 100 upright, and the horizontal holding mode indicates that the user grips the electronic device 100 at the short sides S and make the electronic device 100 horizontal. In the present embodiment, the first heat transfer member 161 is disposed adjacent to the short side S of the electronic device 100. Therefore, when the user holds the electronic device 100 in the vertical holding mode, the user does not easily touch the heat dissipation range covered by the first heat transfer member 161. In comparison, the second heat transfer member 162 is disposed adjacent to the long side L of the electronic device 100. When the user holds the electronic device 100 in the horizontal holding mode, the user does not easily touch the heat dissipation range covered by the second heat transfer member 162.

In the vertical holding mode, it is determined by, for example, the central processing unit or other elements that the electronic device 100 is in a low power consumption state, such as photographing, video recording, or text transmitting states, etc., which are achieved by requiring only the first heating element or requiring the second heating element 150 that operates simultaneously with low power consumption, and the operation of the cooling element 163 stops as indicated in block 304. At this time, since the heat generated by the first heating element 140 is only dissipated through the first heat transfer member 161, the user does not easily touch the part having high temperature, which is caused by the heat dissipation of the first heat transfer member 161, of the electronic device 100 in vertical holding mode, so as to maintain comfort of the user in vertical holding mode.

In the horizontal holding mode, the control unit 170 in the electronic device 100 determines the power consumption of the electronic device 100 as indicated by block 305. Generally, the functions, such as watching movie, gaming, and graphic designing, etc., of the application programs used by the user in the horizontal holding mode are achieved because of the operation of the second heating element 150. At this time, if the power consumption is smaller than a preset value, the control unit 170 determines that the electronic device 100 is at low power consumption state and stops the operation of the cooling element 163 as indicated in block 304, so that the heat generated by the second heating element 150 is only dissipated by the second heat transfer member 162. Therefore, the user does not easily touch the part having high temperature, which is caused by the heat dissipation of the second heat transfer member, of the electronic device in horizontal holding mode, so as to maintain comfort of the user in horizontal holding mode.

In the situation that the power consumption is greater than the preset value, the control unit determines that the electronic device is at high power consumption state, and the cooling element 163 operates as indicated in block 306, so that the heat generated by the second heating element 150 are simultaneously dissipated by the first heat transfer member 161 and the second heat transfer member 162, so as to avoid the situation that the heat is not efficiently dissipated and causes overheating and crash. Since the electronic device 100 performs a fast and large area heat dissipation through both the first heat transfer member 161 and the second heat transfer member 162, the temperature rise of the part of the electronic device 100 is not especially obvious, so as to maintain the comfort of the user while holding the electronic device 100.

In summary, in the heat dissipation module and the electronic device of the disclosure, the dissipation paths of the first heating element and the second heating element are determined according to the operation of the cooling element. Different heat dissipation options are adopted in different holding modes, so as to maintain a certain degree of comfort of the user in any holding modes.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A heat dissipation module, configured for heat dissipation of a first heating element, the heat dissipation module comprising:
 a first heat transfer member, having a first end and a second end opposite to the first end, wherein the first end is in thermal contact with the first heating element;
 a second heat transfer member, having a third end and a fourth end opposite to the third end;
 a cooling element, disposed between the second end and the third end; and
 a control unit, wherein the control unit controls the cooling element to allow the heat transferring between the second end and the third end while a power consumption of the first heating element is greater than a preset value and block the heat transferring between the second end and the third end while the power consumption of the first heating element is smaller than the preset value.

2. The heat dissipation module as recited in claim 1, wherein the first heat transfer member and the second heat transfer member are heat pipes or vapor chambers.

3. The heat dissipation module as recited in claim 1, wherein the cooling element is configured to allow one-way heat transferring between the second end and the third end.

4. An electronic device, comprising:
 a first heating element;
 a second heating element; and
 a heat dissipation module, comprising:
  a first heat transfer member, having a first end and a second end opposite to the first end, wherein the first end is in thermal contact with the first heating element;
  a second heat transfer member, having a third end and a fourth end opposite to the third end, wherein the fourth end is in thermal contact with the second heating element;
  a cooling element, disposed between the second end and the third end, and configured to allow or block the heat transferring between the second end and the third end; and
  a control unit, wherein the control unit controls the cooling element to allow the heat transferring between the second end and the third end while a power consumption of the second heating element is greater than a preset value.

5. The electronic device as recited in claim 4, wherein, when the first heating element generates heat, the cooling element blocks the heat transferring between the second end and the third end.

6. The electronic device as recited in claim 4, wherein the first heat transfer member and the second heat transfer member are heat pipes or vapor chambers.

7. The electronic device as recited in claim 4, wherein the cooling element is configured to allow one-way heat transferring between the second end and the third end.

8. The electronic device as recited in claim 4, further comprising a printed circuit board, wherein the first heating element and the second heating element are disposed on the printed circuit board.

9. The electronic device as recited in claim 8, further comprising a case and a cover, wherein the printed circuit board, the first heating element, the second heating element, and the heat dissipation module are disposed inside the case, and the case and the cover are assembled.

* * * * *